United States Patent
Bradley

(10) Patent No.: US 10,637,567 B1
(45) Date of Patent: Apr. 28, 2020

(54) COMPACT PASSIVE INTERMODULATION (PIM) MEASURING INSTRUMENT

(71) Applicant: ANRITSU COMPANY, Morgan Hill, CA (US)

(72) Inventor: Donald Anthony Bradley, Morgan Hill, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 160 days.

(21) Appl. No.: 15/668,507

(22) Filed: Aug. 3, 2017

(51) Int. Cl.
*H04B 10/077* (2013.01)
*H04B 17/10* (2015.01)
*H04B 17/00* (2015.01)
*H04B 3/46* (2015.01)
*G01R 31/11* (2006.01)
*G01R 23/20* (2006.01)

(52) U.S. Cl.
CPC ......... *H04B 10/0779* (2013.01); *G01R 23/20* (2013.01); *G01R 31/11* (2013.01); *H04B 3/46* (2013.01); *H04B 17/0085* (2013.01); *H04B 17/104* (2015.01)

(58) Field of Classification Search
CPC ............ H04B 10/0779; H04B 17/0085; H04B 17/104; H04B 3/46; G01R 23/20; G01R 31/11
USPC ...................................................... 324/762.1
See application file for complete search history.

(56) References Cited

U.S. PATENT DOCUMENTS

| 4,274,047 A | 6/1981 | Hecken |
| 5,706,010 A | 1/1998 | Franke |
| 5,729,145 A | 3/1998 | Blades |
| 6,144,692 A | 11/2000 | Beck |
| 2002/0094785 A1 | 7/2002 | Deats |
| 2003/0232600 A1 | 12/2003 | Montgomery et al. |
| 2006/0250135 A1 | 11/2006 | Buchwald |
| 2009/0096466 A1 | 4/2009 | Delforce et al. |

(Continued)

FOREIGN PATENT DOCUMENTS

WO 2003030416 4/2003

OTHER PUBLICATIONS

Holzman; A Highly Compact 60-GHz Lens-Corrected Conical Horn Antenna; Pub. Date 2004; IEEE Antennas and Wireless Propagation Letters (Year: 2004).*

(Continued)

*Primary Examiner* — Melissa J Koval
*Assistant Examiner* — Rahul Maini
(74) *Attorney, Agent, or Firm* — Tucker Ellis LLP

(57) ABSTRACT

A measuring instrument for detecting a source of passive intermodulation (PIM) includes a first signal source, a second source and a receiver. The first and second signal sources are each connected with separate transmit antenna to transmit a first and second signal, respectively. The first transmit antenna and the second transmit antenna are arranged in a fixed relationship relative to each other such that the first signal and the second signal are combinable to generate a PIM signal at a PIM. The receiver is connected with a receive antenna and arranged in a fixed relationship relative to the first transmit antenna and the second transmit antenna to receive the PIM signal reradiated from the PIM source. The receiver is configured to receive the PIM signal and indicate detection of the PIM source in response to receiving the PIM signal.

20 Claims, 4 Drawing Sheets

(56) References Cited

U.S. PATENT DOCUMENTS

| | | |
|---|---|---|
| 2009/0125253 A1 | 5/2009 | Blair et al. |
| 2010/0295533 A1 | 11/2010 | Kuga et al. |
| 2011/0037667 A1 | 2/2011 | Varjonen |
| 2016/0050032 A1 | 2/2016 | Emerson |

OTHER PUBLICATIONS

Akmal, M. et al., "An Enhanced Modulated Waveform Measurement System for the Robust Characterization of Microwave Devices under Modulated Excitation", Proceedings of the 6th European Microwave Integrated Circuits Conference, © 2011, Oct. 2011, Manchester, UK, pp. 180-183.

Cunha, Telmo R. et al., "Characterizing Power Amplifier Static AM/PM with Spectrum Analyzer Measurements", IEEE © 2014, 4 pages.

Fager, Christian et al., "Prediction of Smart Antenna Transmitter Characteristics Using a New Behavioral Modeling Approach" IEEE ® 2014, 4 pages.

Fager, Christian et al., "Analysis of Nonlinear Distortion in Phased Array Transmitters" 2017 International Workshop on Integrated Nonlinear Microwave and Millmetre-Wave Circuits (INMMiC), Apr. 20-21, 2017, Graz, Austria, 4 pages.

Martens, J. et al., "Towards Faster, Swept, Time-Coherent Transient Network Analyzer Measurements" 86th ARFTG Conf. Dig., Dec. 2015, 4 pages.

Martens, J., "Match correction and linearity effects on wide-bandwidth modulated AM-AM and AM-PM measurements" 2016 EuMW Conf. Dig., Oct. 2016, 4 pages.

Nopchinda, Dhecha et al., "Emulation of Array Coupling Influence on RF Power Amplifiers in a Measurement Setup", IEEE © 2016, 4 pages.

Pedro, Jose Carlos et al., "On the Use of Multitone Techniques for Assessing RF Components' Intermodulation Distortion", IEEE Transactions on Microwave Theory and Techniques, vol. 47, No. 12, Dec. 1999, pp. 2393-2402.

Ribeiro, Diogo C. et al., "D-Parameters: A Novel Framework for Characterization and Behavorial Modeling of Mixed-Signal Systems", IEEE Transactions on Microwave Theory and Techniques, vol. 63, No. 10, Oct. 2015, pp. 3277-3287.

Roblin, Patrick, "Nonlinear RF Circuits and Nonlinear Vector Network Analyzers; Interactive Measurement and Design Techniques", The Cambridge RF and Microwave Engineering Series, Cambridge University Press © 2011, entire book.

Rusek, Fredrik et al., "Scaling Up MIMO; Opportunities and challenges with very large arrays", IEEE Signal Processing Magazine, Jan. 2013, pp. 40-60.

Senic, Damir et al., "Estimating and Reducing Uncertainty in Reverberation-Chamber Characterization at Millimeter-Wave Frequencies", IEEE Transactions on Antennas and Propagation, vol. 64, No. 7, Jul. 2016, pp. 3130-3140.

Senic, Damir et al., "Radiated Power Based on Wave Parameters at Millimeter-wave Frequencies for Integrated Wireless Devices", IEEE © 2016, 4 pages.

\* cited by examiner

COMPACT PASSIVE INTERMODULATION (PIM) MEASURING INSTRUMENT

TECHNICAL FIELD

The present invention relates to passive intermodulation (PIM) measuring instruments and antennas for use with PIM measuring instruments.

BACKGROUND

Passive intermodulation (PIM), commonly referred to as "rusty bolt effect," is the generation of unwanted signals by the non-linear mixing of two or more frequencies in a passive device, such as a connector or cable, that normally behaves linearly but when subject to high radio frequency (RF) power tones behaves nonlinearly. Non-linear behavior affecting a system can result, for example, from a loose or corroded connector or from the close proximity of the system to oxidized metal. Non-linear behavior affecting a system emitting RF signals can also result from the re-radiation of emitted signals from sources outside of the system, such as unrelated antennas, lighting fixtures, HVAC ducts, exposed metal such as roof flashing, unexposed metal and fasteners hidden beneath roofing tar, etc.

PIM has surfaced as a particular problem for cellular systems. If the generated PIM harmonic frequency components fall within the receive band of a base station of a cellular site, they can effectively block a channel and make the base station receiver think that a carrier signal is present when one is not. Generally the harmonics of concern are third, fifth, and seventh order, where the third order is of greatest signal strength, and therefore, of primary concern.

Test systems are available to measure PIM by creating signals at different frequencies, amplifying and combining them, and providing them to components of a cellular system and measuring a reflected signal generated by a PIM source within the components. Once a PIM source is identified, PIM can be reduced or eliminated by replacing or removing the PIM source. For example, PIM is commonly resolved by replacing faulty cables or connectors, or by removing re-radiating sources.

While such test systems may be effective for identifying PIM sources within a cellular system, other sources of PIM existing outside of the cellular system are not identifiable by measuring the response of the components internal to the cellular system. Test systems for measuring PIM can be connected via a test port to a transmit/receive antenna to detect PIM beyond the antenna and to approximate a distance to the source of the PIM. However, while the distance can be approximated, the direction may not be easily determined with a typical antenna usable for PIM detection. Further, such test systems can be bulky and high powered, making them impractical for mobile use in tracking down PIM sources in the field, external to the affected system.

SUMMARY

A measuring instrument for detecting a source of passive intermodulation (PIM) includes a first signal source, a second source and a receiver. The first and second signal sources are each connected with separate transmit antenna to transmit a first and second signal, respectively. The first transmit antenna and the second transmit antenna are arranged in a fixed relationship relative to each other such that the first signal and the second signal are combinable to generate a PIM signal at a PIM. The receiver is connected with a receive antenna and arranged in a fixed relationship relative to the first transmit antenna and the second transmit antenna to receive the PIM signal reradiated from the PIM source. The receiver is configured to receive the PIM signal and indicate detection of the PIM source in response to receiving the PIM signal.

BRIEF DESCRIPTION OF THE DRAWINGS

Further details of the present invention are explained with the help of the attached drawings in which.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout.

In the following description, numerous specific details are set forth to provide a thorough description of the invention. However, it will be apparent to those skilled in the art that the invention may be practiced without these specific details. In other instances, well-known features have not been described in detail so as not to obscure the invention.

Figure 1:
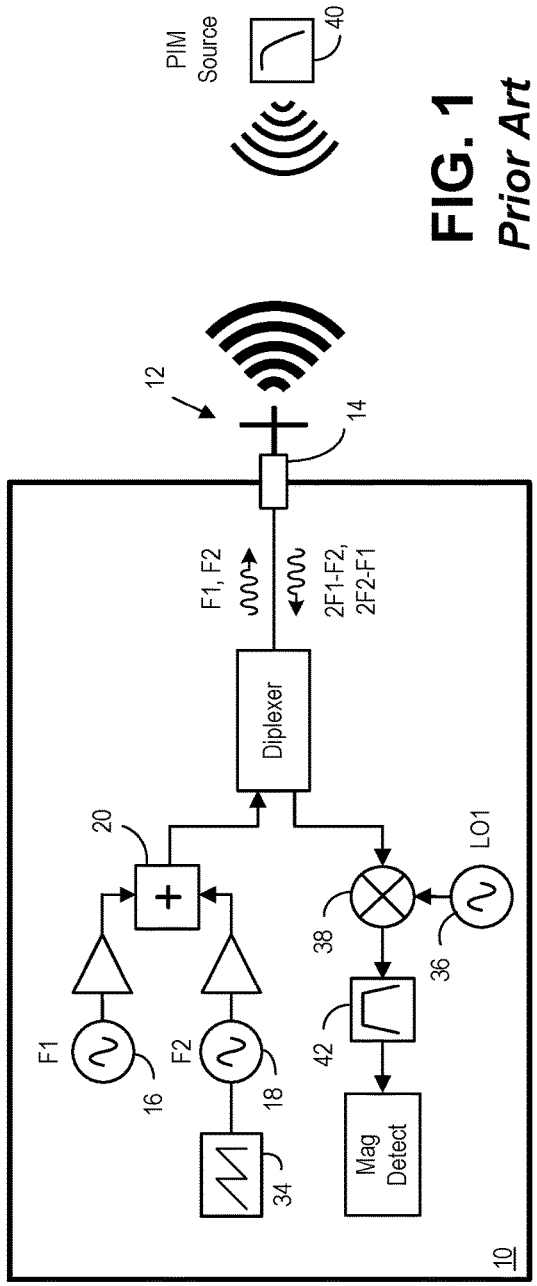
FIG. 1 is a simplified block diagram of a measuring instrument for measuring passive intermodulation (PIM), in accordance with the prior art.

FIG. 1 is a block diagram of an exemplary measuring instrument 10 usable with an antenna 12 for measuring PIM generated by a PIM source 40 using frequency modulated, continuous wave or pulsed signals. The measuring instrument resembles measuring instruments described, for example, in U.S. Pat. No. 8,058,880 entitled "CALIBRATED TWO PORT PASSIVE INTERMODULATION (PIM) DISTANCE TO FAULT ANALYZER" issued to Bradley, et al. and incorporated herein by reference, and is merely exemplary.

The measuring instrument utilizes two signal sources, with a first signal source 16 producing a signal at fixed frequency F1 and a second signal source 18 producing a signal at frequency F2. A frequency modulated (FM) sweep can be introduced using a sweep generator 34 connected to the second signal source. The signals are provided to a combiner 20 to create a combined test signal with frequency components F1 and F2 at the combiner output. A diplexer passes the test signal to a test port 14 connected with the antenna, which transmits the test signal. When the test signal is transmitted to the PIM source, unwanted PIM signals comprising harmonics of the test signal are generated and can be reflected back to the antenna.

The third order response of the reflected signal is of particular interest as it includes signals of higher power relative to other harmonics. For the test signal having components F1 and F2, the third order response occurs at frequencies 2F1-F2 and 2F2-F1. PIM signals reflected back and received at the antenna include these third order signals, one or both of which can be filtered and forwarded to be downconverted to an intermediate frequency (IF) for processing. The reflected signal is downconverted in one or more stages each including a mixer 38 at which the reflected signal is mixed with a signal, LO1, generated by a local oscillator (LO) 36. The target frequency or frequencies are selected by filtering the mixer output using a low-pass filter 42. As shown, the reflected signal is downconverted to a target intermediate frequency in a single stage, although in other embodiments the reflected signal can be downconverted by a single stage or additional stages. The magnitude of the IF signal is measured by a receiver.

Figure 2:
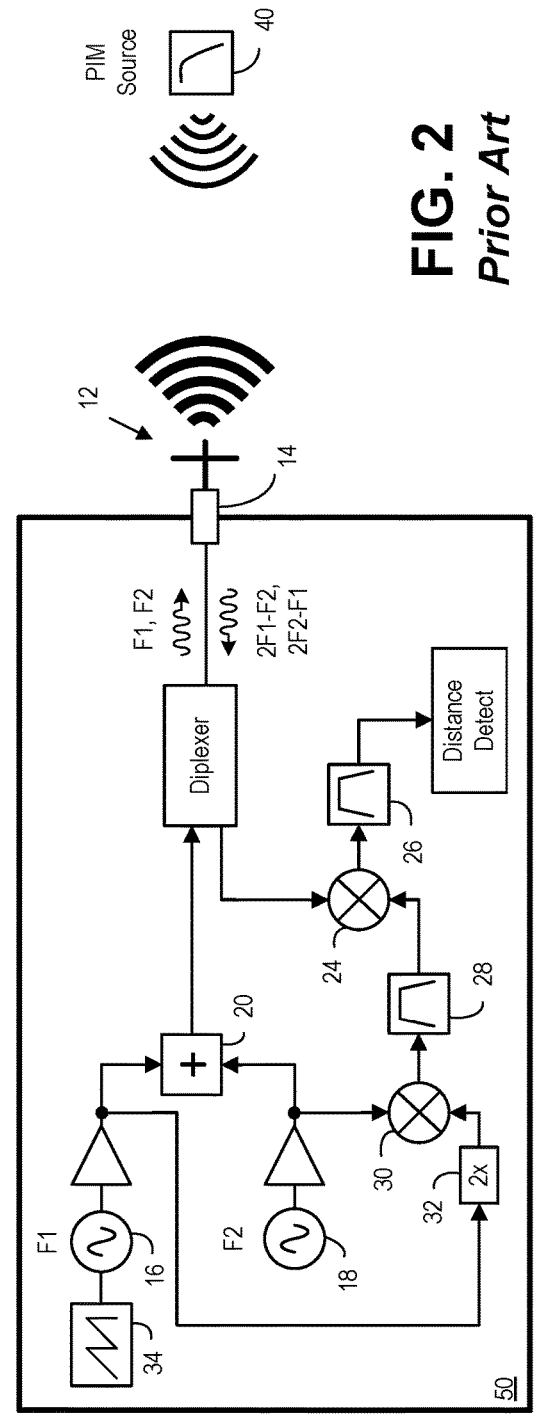
FIG. 2 is a simplified block diagram of a measuring instrument for determining a distance to a source of PIM, in accordance with the prior art.

FIG. 2 is a block diagram of an alternative exemplary measuring instrument 50 further usable for determining a distance to the PIM source. As illustrated, a frequency modulated (FM) sweep can be introduced using a sweep generator 34 connected to the first signal source. A test signal having frequency components comprising the frequency modulated sweep signal F1 and the fixed signal F2, can stimulate the PIM source to produce the additional signals 2(F1+FM)−F2 and 2F2−(F1+FM). The delayed-in-time (distance) signal 2(F1+FM)−F2 can be mixed with an internally generated, non-delayed signal 2(F1+FM)−F2 to produce the desired measurement signal ΔF. A distance-to-fault from the antenna can be determined based on ΔF.

To provide a signal source for downconversion, a 2× frequency multiplier 32 connected to the first signal source provides a swept output to a first input of a mixer 30. A second input of the mixer is provided by the second signal source to generate the non-delayed signal. A bandpass filter 28 eliminates undesired mixing products from the mixer to provide a first input to a downconverting mixer 24. A second input of the downconverting mixer is provided from a diplexer that filters the reflected signal from the PIM source. The output of the downconverting mixer leaves substantially only the frequency deviation ΔF due to the PIM signal generated by the PIM source. A low-pass filter 26 removes undesired mixing products, leaving only a forward trace sweep ΔF and retrace sweep signal 45 MHz−ΔF. Measurement of ΔF with a digital receiver using Fourier transform to time domain or a spectrum analyzer gives a measurement of total distance of the test port to the PIM source, with post processing to account for the both the forward sweep ΔF and retrace 45 MHz−ΔF.

The measuring instruments of FIGS. 1 and 2 are merely exemplary, and measuring instruments for measuring PIM magnitude and distance to a PIM source can include different and/or additional components, and other configurations can be used to measure PIM magnitude and/or distance to a PIM source.

A measuring instrument can be connected with an antenna installed at a cellular site and intended for transmitting and receiving cellular signals from user equipment, for example, to transmit test signals for measuring PIM affecting that cellular site. As an example, antennas for cellular sites installed on roofs or telephone poles can commonly exhibit about 13 decibels (dB) of gain. In a typical test setup, a measuring instrument as described above in FIGS. 1 and 2 transmits a test signal comprising a 20 Watt (W) tone generated by the first signal source and a 20 W tone generated by the second signal source.

A PIM source located in the environment surrounding the cellular site that is negatively impacting performance of the cellular site will likely generate a PIM signal detectable with the measuring instrument performing a sweep of frequencies. As described above, the measuring instrument can detect the magnitude of the PIM signal, and in some configurations can detect a distance to the PIM source. However, the generally wide radiation pattern of such an antenna can prevent or frustrate the ability to readily identify a location of the PIM source. Further, measuring instruments configured for generating 2×20 W tones are generally bulky and cumbersome, and consume a great deal of power, and can be difficult to use portably, even with a directional antenna such as a Yagi antenna connected at the test port.

Detection of PIM Using Compact Antennas

Methods and measuring instruments for applying methods in accordance with embodiments of the present invention can stimulate the generation of PIM at a PIM source and measure reflected and/or re-reradiated PIM signals using components capable of inclusion in a relatively compact, low power form factor. Such embodiments can enable the use of portable instruments that allow an environment to be explored and tested to identify the location of a PIM source.

It can be useful and/or desirable for transmitted signals to have a radiated power comparable to or greater than the radiated power of test signals comprising two 20 W tones generated, for example, by a measuring instrument as describe above and transmitted via an antenna of a test site, such as a cellular site. Preferably, the power of the signals irradiating the PIM source is matched or exceeded, as it is known that such power is a power at which PIM signals are reradiated by the PIM source such that the PIM signals cause problems at the test site. However, the PIM source can be irradiated with higher power signals and the PIM source will reradiate a PIM approximately 2.5 dB higher for every 1 dB of increased power. However power can be expensive as test signal frequencies increase, including into the millimeter range.

A radiated power comparable to or greater than the radiated power of the test setup described above can be achieved with test signals generated at comparatively lower power by reducing the size of the signal wavefront created by an antenna transmitting the lower power test signals. The gain of a transmit antenna is proportional to the radiated beam width of the antenna. By increasing a frequency of a test signal, the radiated beam width of the antenna can be reduced and the gain of the antenna thereby increased. As an example, gain achieved with an antenna having a diameter of 30 inches transmitting a 6 GHz signal can be roughly achieved by an antenna having a diameter of 3 inches transmitting a 60 GHz signal.

Compact antennas have been demonstrated that can transmit comparatively higher frequency signals having substantially reduced signal wavefronts relative to typical antennas of test sites including cellular and other sites. A test signal amplified to a power of 1 W internal to a measuring instrument can achieve radiated power levels using a compact antenna that are comparable to the radiated power levels of signals transmitted by the test setup described above with a measuring instrument generating a test signal comprising two 20 W tones connected with the test site antenna.

However, as the frequencies of signals generated and received by a measuring instrument increase, for example to frequencies within the millimeter wave band (i.e., above 30 GHz), maintaining isolation of the signals can be problematic and the signals generated and received can themselves interact to generate PIM internal to the measuring instrument. For example, a tone generated by a first signal source at sufficiently high frequencies can leak via the combiner and interact with the amplifier for a second signal source to generate PIM. As frequencies increase, isolation of the amplifiers and other components of the measuring instruments can break down and the measuring instrument can become unusable for making meaningful measurements of PIM generated by a PIM source.

Figure 3:
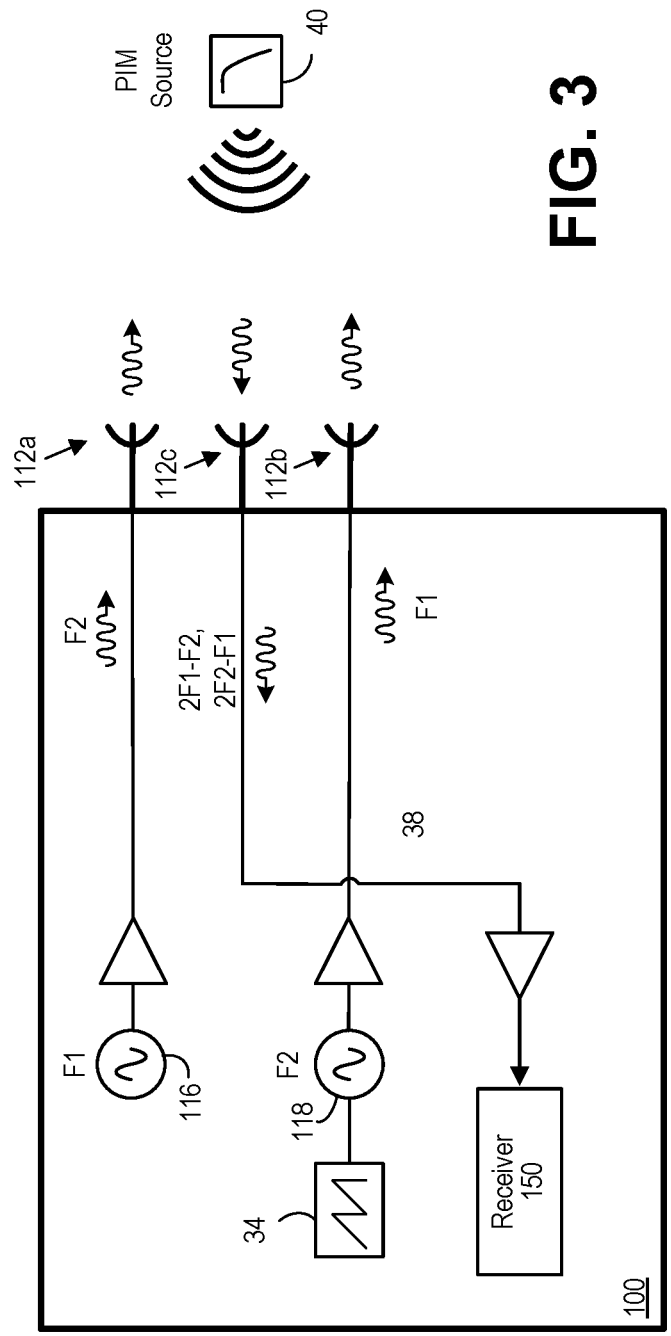
FIG. 3 is a simplified diagram of a measuring instrument for detecting and/or measuring PIM, in accordance with an embodiment.

Referring to FIG. 3, in accordance with an embodiment, a measuring instrument 100 comprises a pair of transmit antennas 112a, 112b that transmit two separate tones, generated by a first signal source 116 and a second signal source 118, respectively, isolated from each other and not combined internally to the measuring instrument to ensure that PIM is not generated internally by interaction of the signal sources. As shown, the first signal source can be used to generate a fixed signal, F1, while the second signal source can be used to generate a swept signal, F2.

In accordance with an embodiment, the transmit antennas can be arranged in a fixed or otherwise known position relative to one another so that signals transmitted by the antennas can interact and the signal components can combine so that the combined test signal will stimulate the generation of PIM at a PIM source 40. In accordance with an embodiment, the transmit antennas will have beam widths of approximately 6 degrees, so that when arranged in proximity to one another and flat surface mounted relative to one another the transmitted beams will overlap so as to create a test signal of multiple frequency components to stimulate generation of PIM products.

The measuring instrument further comprises a receive antenna 112c for receiving PIM signals reflected or reradiated by a PIM source in response to transmitted signals. A receiver 150, such as a receiver resembling those described above with respect to FIGS. 1 and 2, can be used to measure PIM signals generated by the PIM source and, where configured to do so, measure a distance to the PIM source.

In accordance with an embodiment, the transmit and receive antennas can each comprise a conical horn antenna adapted to transmit high frequency signals having substantially reduced signal fronts relative to typical antennas of cellular and other sites.

In accordance with an embodiment, the transmit and receive antennas can each comprise a highly compact, lens-corrected conical horn antenna. In such an embodiment, the measuring instrument can, using signal sources generating a pair of tones each amplified to powers of 1 W internal to the measuring instrument, achieve radiated power levels that are comparable to or greater than the radiated power levels of signals transmitted by the test setup described above with a measuring instrument of the prior art generating a test signal comprising two 20 W tones connected with the test site antenna.

In accordance with an embodiment, a conical horn antenna usable with the measuring instrument can include a conical horn antenna transmitting signals at millimeter wavelengths, such as described, for example, by Eric L. Holzman in "A Highly Compact 60-GHz Lens-Corrected Conical Horn Antenna," *IEEE Antennas and Wireless Propagation Letters*, Vol. 3, Issue 1, December 2004. The conical horn antenna can include a hyperbolic lens usable to reduce the horn focal length, and thereby reduce a minimum housing thickness of the measuring instrument.

In accordance with an embodiment, the hyperbolic lens can include a stepped hyperbolic lens comprising a dielectric material. In accordance with an embodiment, the hyperbolic lens can include a two-step hyperbolic lens. In accordance with an embodiment, the lens can comprise a cross-linked polystyrene, microwave plastic, for example REXOLITE™ manufactured by C-Lec Plastics Inc. In other embodiment the lens can have some other geometry and comprise some other transmission material.

In accordance with an embodiment, a lens-corrected conical horn antenna transmitting a millimeter wave tone having a frequency, for example, including 60 GHz can be used. Such an antenna can be compactly sized, having an approximately 3 inch diameter and a focal length of approximately 1.5 inches, enabling the inclusion of two transmit antennas and a receive antenna within or connected to an instrument housing.

Figure 4A:
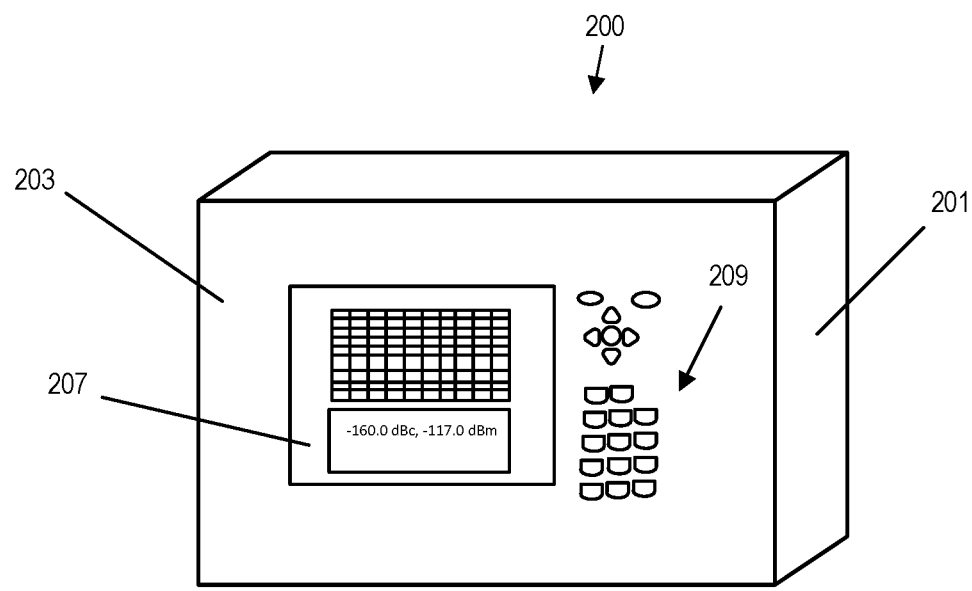
FIGS. 4A and 4B illustrates a measuring instrument for detecting and/or measuring PIM, in accordance with an embodiment.
Figure 4B:
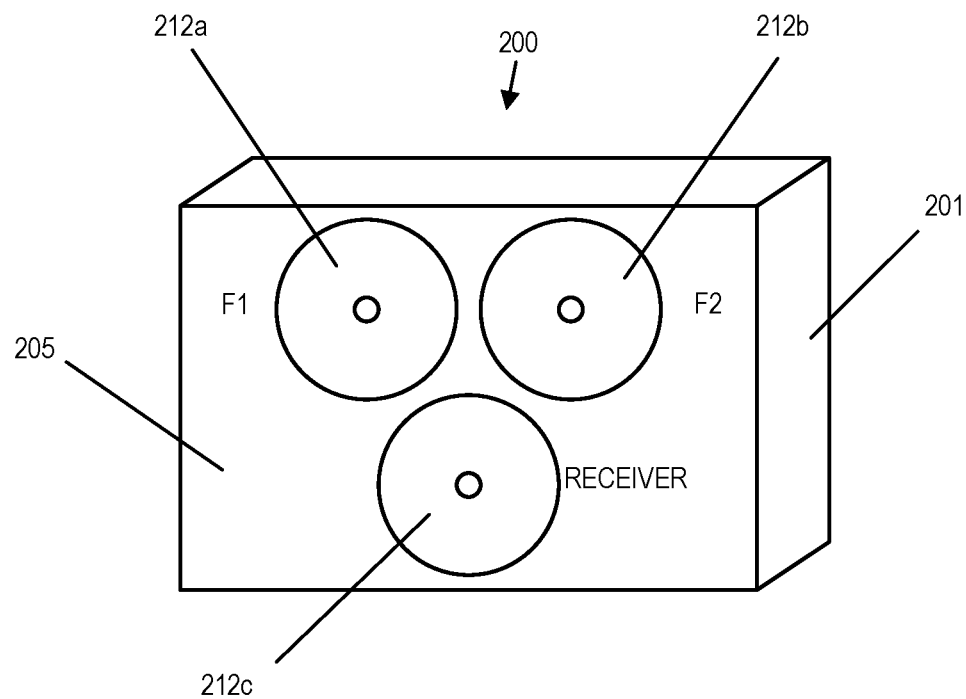

FIGS. 4A and 4B illustrates a measuring instrument 200 for detecting and/or measuring PIM, in accordance with an embodiment. In accordance with an embodiment, the measuring instrument comprises a housing 201 with the front of the measuring instrument 203 including a display 207 for displaying a PIM measurement and a keypad 209 for input. However, in other embodiments, the measuring instrument can include a touch screen display for input rather than a keypad. In still other embodiments, the measuring instrument need not necessarily include a display or input device, but rather merely include a power switch and an indicator for indicating detection of a PIM source, for example.

The back of the measuring instrument 203 can include a first transmit antenna 212a for transmitting a tone at frequency F1 and a second transmit antenna 212b for transmitting a tone at frequency F2. A receive antenna 212c receives a PIM signal generated at a PIM source. The first transmit antenna, the second transmit antenna and the receive antenna can each be mounted within the housing in a fixed relationship relative to one another. As noted above, the transmit and receive antennas can be quite compact, for example, measuring 3 inches in diameter and the measuring instrument can be relatively compact, with the antennas having a depth of 1.5 inches. Further, the bulk and weight of the measuring instrument can be reduced by using relatively low power sources generating signals at approximately 1 W, for example.

In accordance with an embodiment, the measuring instrument can further include a visual indicator, such as a laser sight, that can indicate a general location of a PIM source by highlighting the general location via a visible-light laser. This can be useful, for example, at a location where a PIM source is concealed, such as a piece of roof flashing hidden under roofing tar. A laser sight can be located at the back of the measuring instrument, centered between the transmit and receive antennas, for example. Further, light emitted by a laser can also include a distance function similar to laser range finders. Using the laser, a distance to a PIM source and the travel distance of the laser can be matched to indicate where the PIM source is located.

In a further embodiment, a distance to a detected PIM source can be determined using techniques similar to those described with respect to FIG. 3. In such an embodiment, the frequency of the signal transmitted by one of the two signal sources is swept while the receiver is swept over the frequencies of the intermodulation products.

Figure 5:
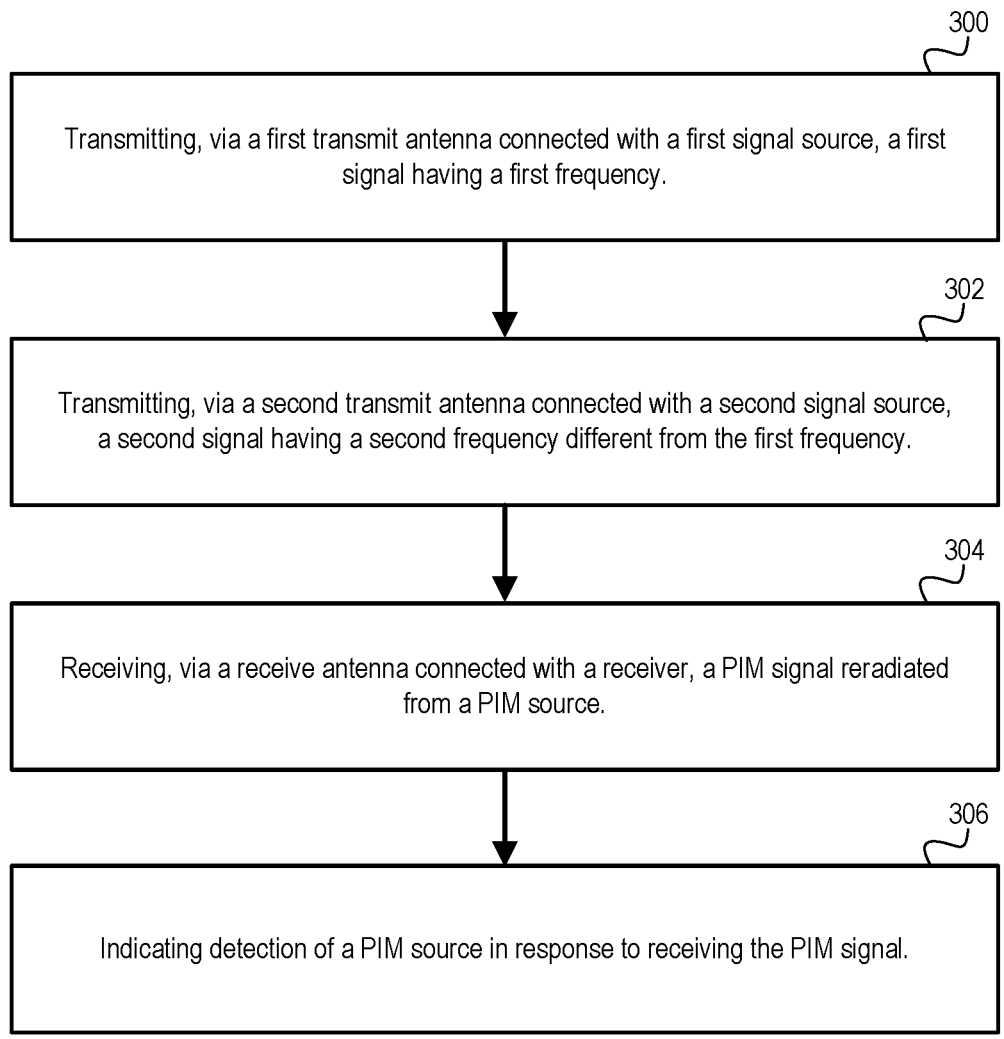
FIG. 5 is a flowchart of a method for detecting objects by stimulating the generation of PIM, in accordance with an embodiment.

FIG. 5 is a flowchart for a method for detecting a PIM source, in accordance with an embodiment. A first transmit antenna connected with a first signal source transmits a first signal having a first frequency (Step 300). A second transmit antenna connected with a second signal source transmits a second signal having a second frequency different from the first frequency (Step 302). The first transmit antenna and the second transmit antenna can be arranged in a fixed relationship relative to each other such that the first signal and the second signal are combinable to generate a PIM signal at a PIM source. For example, the first transmit antenna and the second transmit antenna can be mounted in a housing of a measuring instrument.

A receive antenna connected with a receiver is configured and arranged to receive a PIM signal reradiated from a PIM source comprising an intermodulation product of a test signal comprising the first and second signals as components (Step 304). The receive antenna can likewise be mounted in the housing of the measuring instrument. Detection of an object is indicated in response to receiving the PIM signal (Step 306).

The transmitted signals can be targeted to different locations in an environment until the transmitted signals interact with a PIM source in the environment and the reradiated PIM signal is received. For example, a technician using the portable measuring instrument can scan an area located around a test site antenna looking for a possible source of PIM interfering with the test site until a PIM signal is detected. The technician can carry the measuring instrument and move about the environment searching for a PIM signal indicating the location of a PIM source. That PIM source, once located, can then be eliminated or mitigated.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. A portable measuring instrument for detecting a source of passive intermodulation (PIM source), the portable measuring instrument comprising:
    a housing having a flat surface;
    a first signal source for generating a fixed frequency;
    a first transmit antenna connected with the first signal source to transmit a first signal beam having the fixed frequency;
    a second signal source for generating a plurality of frequencies in a frequency sweep;
    a second transmit antenna connected with the second signal source to transmit a second signal beam having the plurality of frequencies in the frequency sweep;
    wherein the first transmit antenna and the second transmit antenna are arranged in a fixed relationship relative to each other on the flat surface of the housing such that the first signal beam and the second signal beam overlap to create a test signal beam comprising multiple frequency components external to the housing in order to stimulate the PIM source to generate a PIM source signal;
    a receiver; and
    a receive antenna connected with the receiver and arranged in a fixed relationship relative to the first transmit antenna and the second transmit antenna;
    wherein the receiver is configured to receive the PIM source signal generated by the PIM source in response to the test signal beam and indicate detection of the PIM source in response to receiving the PIM source signal.

2. The portable measuring instrument of claim 1, wherein:
    the first transmit antenna is a conical horn antenna, and
    the second transmit antenna is a conical horn antenna.

3. The portable measuring instrument of claim 1, wherein:
    the first transmit antenna is a conical horn antenna having a two-step hyperbolic lens, and
    the second transmit antenna is a conical horn antenna having a two-step hyperbolic lens.

4. The portable measuring instrument of claim 1, wherein:
    the first transmit antenna is a conical horn antenna having a diameter no greater than 3 inches, and
    the second transmit antenna is a conical horn antenna having a diameter no greater than 3 inches.

5. The portable measuring instrument of claim 1, wherein:
    the first source is isolated from the second source to ensure no passive intermodulation is generated internal to the instrument by interaction between the sources.

6. The portable measuring instrument of claim 1, wherein:
    the first transmit antenna is configured so that the first signal beam has a beam angle no greater than six degrees; and
    the second transmit antenna is configured so that the second signal beam has a beam angle no greater than six degrees.

7. The portable measuring instrument of claim 1, further comprising:
    a visible light laser mounted to the housing for indicating a general location of the PIM source.

8. The portable measuring instrument of claim 1, further comprising:
    a visible light laser range finder mounted to the housing for indicating a general location of the PIM source and distance to the PIM source.

9. The portable measuring instrument of claim 1, further comprising:
    an input device and an indicator for indicating detection of the PIM source.

10. The portable measuring instrument of claim 1, wherein:
    the measuring instrument is configured to measure the PIM source signal generated by the PIM source and measure a distance from the measuring instrument to the PIM source.

11. A method for detecting a source of passive intermodulation (PIM source), the method comprising:
    providing a portable measuring instrument comprising,
        a housing having a flat surface,
        a first transmit antenna and a second transmit antenna arranged in a fixed relationship relative to each other on the flat surface of the housing,
        a receive antenna arranged in a fixed relationship relative to the first transmit antenna and the second transmit antenna,
        a first signal source connected to the first antenna,
        a second signal source connected to the second antenna, and
        a receiver connected to the receive antenna, generating a fixed frequency with the first signal source causing the first transmit antenna to transmit a first signal beam having the fixed frequency;

generating a plurality of frequencies in a frequency sweep with the second signal source thereby causing the second transmit antenna to transmit a second signal beam having the plurality of frequencies in the frequency sweep;

whereby the first signal beam and the second signal beam overlap to create a test signal beam comprising multiple frequency components external to the housing in order to stimulate the PIM source to generate a PIM source signal;

receiving, with the receiver via the receive antenna, the PIM source signal generated by the PIM source in response to the test signal beam; and indicating detection of the PIM source in response to receiving the PIM source signal.

12. The method of claim 11, wherein:
the first transmit antenna is a conical horn antenna, and
the second transmit antenna is a conical horn antenna.

13. The method of claim 11, wherein:
the first transmit antenna is a conical horn antenna having a two-step hyperbolic lens, and
the second transmit antenna is a conical horn antenna having a two-step hyperbolic lens.

14. The method of claim 11, wherein:
the first transmit antenna is a conical horn antenna having a diameter no greater than 3 inches, and
the second transmit antenna is a conical horn antenna having a diameter no greater than 3 inches.

15. The method of claim 11, wherein:
the first source is isolated from the second source to ensure no passive intermodulation is generated internal to the instrument by interaction between the sources.

16. The method of claim 11, wherein:
the first transmit antenna is configured so that the first signal beam has a beam angle no greater than six degrees; and
the second transmit antenna is configured so that the second signal beam has a beam angle no greater than six degrees.

17. The method of claim 11, further comprising:
providing a visible light laser mounted to the housing;
using the visible light laser to indicate a general location of the PIM source.

18. The method of claim 11, further comprising:
providing a visible light laser range finder mounted to the housing;
using the visible light laser range finder mounted to the housing to indicate a general location of the PIM source and distance to the PIM source.

19. The method of claim 11, further comprising:
measuring the PIM source signal generated by the PIM source and determining from the PIM source signal a distance from the measuring instrument to the PIM source.

20. A portable measuring instrument for detecting a source of passive intermodulation (PIM source), the portable measuring instrument comprising:
a housing having a flat surface;
a first transmit antenna and a second transmit antenna arranged in a fixed relationship relative to each other on the flat surface of the housing;
a receive antenna arranged in a fixed relationship relative to the first transmit antenna and the second transmit antenna;
a first signal source connected to the first antenna;
a second signal source connected to the second antenna; and
a receiver connected to the receive antenna;
wherein the portable measuring instrument is configured to perform steps comprising,
generating a fixed frequency with the first signal source causing the first transmit antenna to transmit a first signal beam having the fixed frequency,
generating a plurality of frequencies in a frequency sweep with the second signal source thereby causing the second transmit antenna to transmit a second signal beam having the plurality of frequencies in the frequency sweep,
whereby the first signal beam and the second signal beam overlap to create a test signal beam comprising multiple frequency components external to the housing in order to stimulate the PIM source to generate a PIM source signal,
receiving, with the receiver via the receive antenna, the PIM source signal generated by the PIM source in response to the test signal beam, and
indicating detection of the PIM source in response to receiving the PIM source signal.

\* \* \* \* \*